United States Patent
Choi et al.

(10) Patent No.: US 8,722,317 B1
(45) Date of Patent: May 13, 2014

(54) TRANSPARENT MEMBER HAVING AN IMAGE AND METHOD FOR FORMING THE IMAGE ON THE TRANSPARENT MEMBER

(71) Applicant: LAON innotech Co., Ltd., Seongnam-si (KR)

(72) Inventors: Choon Ho Choi, Yongin-si (KR); Ji Young Lee, Seongnam-si (KR)

(73) Assignee: LAON innotech Co., Ltd. (KR)

( * ) Notice: Subject to any disclaimer, the term of this patent is extended or adjusted under 35 U.S.C. 154(b) by 0 days.

(21) Appl. No.: 13/744,912

(22) Filed: Jan. 18, 2013

(30) Foreign Application Priority Data

Dec. 4, 2012  (KR) .......................... 10-2012-0139741

(51) Int. Cl.
*G03F 7/20* (2006.01)

(52) U.S. Cl.
USPC .......................................... 430/321; 430/323

(58) Field of Classification Search
None
See application file for complete search history.

(56) References Cited

U.S. PATENT DOCUMENTS

| | | | |
|---|---|---|---|
| 4,534,620 A * | 8/1985 | Gale et al. ..................... | 359/582 |
| 4,652,513 A * | 3/1987 | Pentak et al. .................. | 430/258 |
| 2006/0088773 A1 * | 4/2006 | Bellman et al. ................. | 430/5 |
| 2012/0318585 A1 * | 12/2012 | Kim et al. ................... | 178/18.03 |

* cited by examiner

*Primary Examiner* — John A. McPherson
(74) *Attorney, Agent, or Firm* — Cantor Colburn LLP

(57) ABSTRACT

There is provided a method for forming an image on a transparent member, the method comprising: a) forming a coating layer on a surface of the transparent member; b) attaching a dry film photoresist on the coating layer; c) exposing the dry film photoresist by covering the dry film photoresist with a photo mask having an image pattern and irradiating the photo mask with UV; d) performing a development process for removing other area of the dry film photoresist except for an image area of the dry film photoresist; e) performing an etching process for removing other area of the coating layer except for the image area of the coating layer facing the image area of the dry film photoresist; and f) performing a strip process for removing the image area of the dry film photoresist.

7 Claims, 5 Drawing Sheets

TRANSPARENT MEMBER HAVING AN IMAGE AND METHOD FOR FORMING THE IMAGE ON THE TRANSPARENT MEMBER

CROSS-REFERENCE TO RELATED APPLICATIONS

This application claims the priority of Korean Patent Application No. 2012-0139741 filed on Dec. 4, 2012, in the Korean Intellectual Property Office, the disclosure of which is incorporated herein by reference.

BACKGROUND OF THE INVENTION

1. Field of the Invention

The present invention relates to a transparent member having an image, and a method for forming the image on the transparent member.

2. Description of the Related Art

IT devices such as PC tablets, smartphones, or smart TVs include a display panel and a touch screen. In general, a touch screen includes a glass substrate and circuit, and thereby includes a circuit layer layered to the glass substrate, a bonding layer layered to the circuit layer, and a transparent cover layered to the bonding layer. A user inputs a signal to IT devices by contacting a transparent cover of the touch screen of the IT devices with his or her finger.

Meanwhile, a user attaches a thin transparent protective cover manufactured by using a transparent tempered glass or a transparent plastic material to a transparent cover of a touch screen in order to protect IT devices, especially, the transparent cover of the touch screen of a smartphone and beautify the appearance of the smartphone, and then attaches an image film formed with images such as animal shapes or logos, produced by using a thin film on the top or bottom of the transparent protective cover.

However, when a transparent protective cover is attached on a touch screen of IT devices, and then an image film is attached on the transparent protective cover, there is a problem that the image film is easily detached and partially covers on the pictures of the touch screen, so that its use is inconvenient when a user is carrying and uses the smartphone (hereinafter, referred to as a transparent member as the collective name for a transparent cover of a touch screen and a transparent protective cover attached on a transparent cover of a touch screen).

In the case of PC tablets or smart TVs, a logo image of a product manufacturer is formed by using a silk printing method, a hologram method, or the like on edge parts of a transparent cover of a display panel (or a touch screen).

However, there is a problem that since a logo image is formed on top or bottom corner parts of a display panel (or a touch screen), the logo image may cover part of the screen when an information screen is displayed even on the corner parts of the display panel.

SUMMARY OF THE INVENTION

An object of the present invention is to prevent a damage of an image included in a display part including a touch screen of IT devices such as PC tablets, smartphones, or smart TVs when the IT devices are used.

In addition, an object of the present invention is to realize that when the IT devices are turned off, an image such as logos or characters is seen on a display, while when the IT devices are turned on, the image such as the logos or characters is not seen, but an information screen is only seen.

In order to achieve an object of the present invention, there is provided a method for forming an image on a transparent member, including a) forming a coating layer on a surface of the transparent member; b) attaching a dry film photoresist on the coating layer; c) exposing the dry film photoresist by covering the dry film photoresist with a photo mask having an image pattern and irradiating the photo mask with UV; d) performing a development process for removing other area of the dry film photoresist except for an image area of the dry film photoresist irradiated with UV thorough the image pattern of the photo mask; e) performing an etching process for removing other area of the coating layer except for the image area of the coating layer facing the image area of the dry film photoresist; and f) performing a strip process for removing the image area of the dry film photoresist.

In addition, in order to achieve an object of the present invention, there is a provided a transparent member having an image, in which a coating layer including an image shape having a smaller area than that of a transparent member is included on the surface of the transparent member, and a thickness of the coating layer is 0.01 to 2 μm. An optical transmittance of the coating layer is 50 to 95%.

The coating layer includes a plurality of layers, and preferably, the plurality of layers includes a first layer formed with titanium oxide and a second layer formed with silicon oxide.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE PREFERRED EMBODIMENT

Hereinafter, a transparent member including an image and a method for forming an image on the transparent member, according to the present invention, will now be described with reference to the accompanying drawings.

Figure 1:
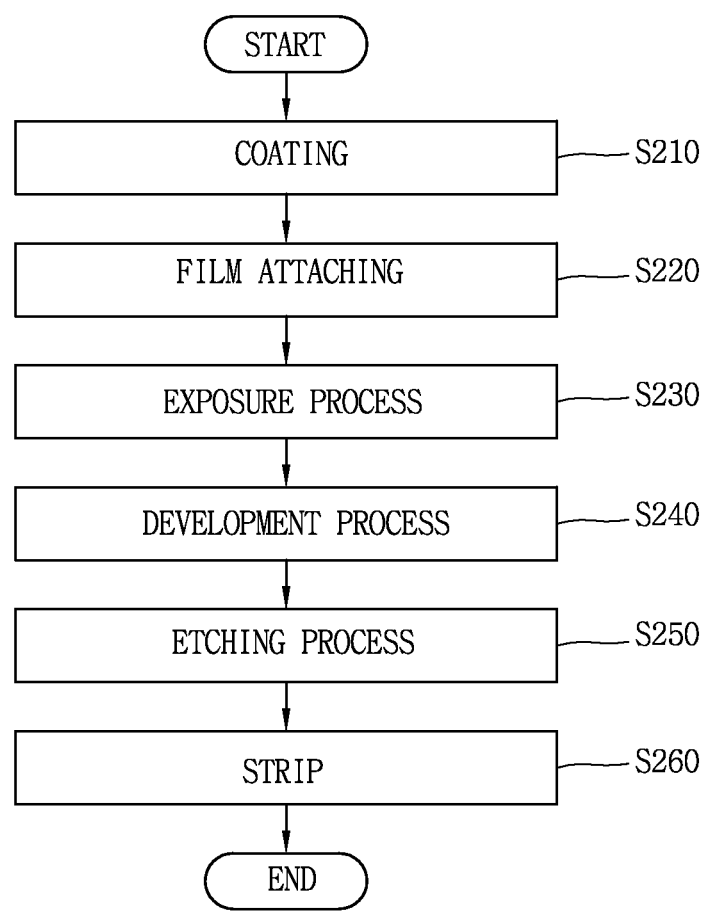
FIG. 1 is a flow chart illustrating an embodiment of the method for forming an image on a transparent member according to the present invention.
Figure 2:
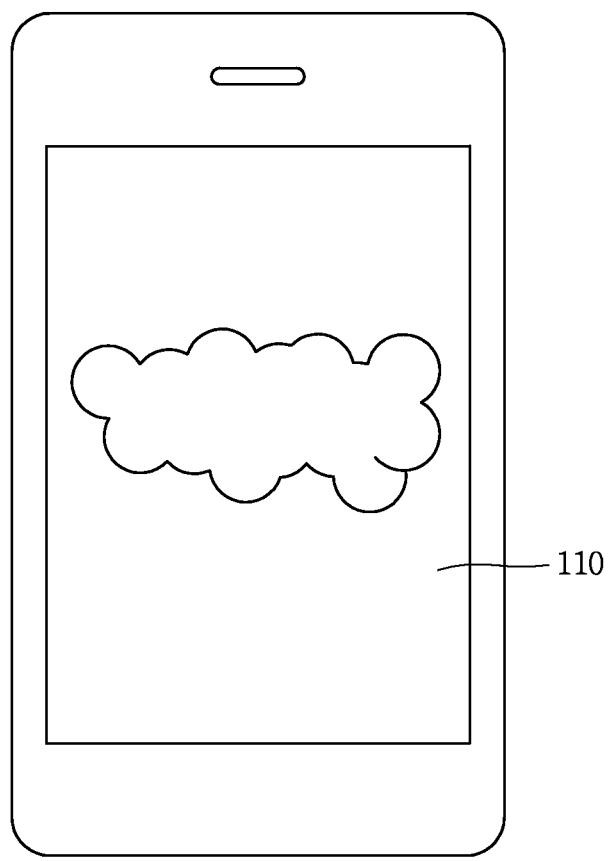
FIG. 2 is a front view illustrating an embodiment of the transparent member including an image, according to the present invention.

FIG. 1 is a flow chart illustrating an embodiment of the method for forming an image on a transparent member according to the present invention. FIG. 2 is a front view illustrating an embodiment of a transparent member including an image, according to the present invention. FIGS. 3A to 3E are respectively cross-sectional diagrams illustrating the method for forming an image on a transparent member according to the present invention by stages.

As illustrated in FIGS. 1, 2, and 3A to 3E, according to an embodiment of the method for forming an image on a transparent member 110 according to the present invention, a coating layer 120 is first formed on a surface of the transparent member 110 (S210).

Figure 3A:
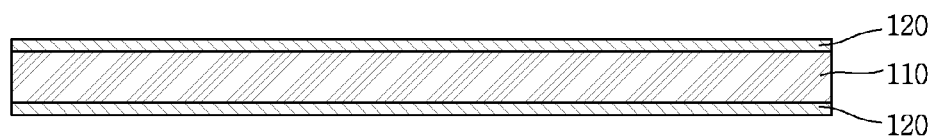
FIG. 3A is a cross-sectional view illustrating that two coating layers are formed on a transparent member.

As illustrated in FIG. 3A, the transparent member 110 is preferably a plane plate having a uniform thickness. The transparent member 110 may be a curved plate. The transparent member 110 may be a transparent tempered glass or a transparent plastic material. The transparent member 110 may be a transparent cover constituting a touch screen of IT devices such as PC tablets, smartphones, or smart TVs, or may be a transparent protective cover that is attached on a transparent cover of a touch screen for protecting the touch screen of the IT devices. In addition, the transparent member 110 may be a cover glass of a display panel without a touch screen. In the transparent member 110, a part in contact with a user is referred to as a front side, and the opposite side thereof is referred to as a back side.

A coating layer 120 may be formed on a front side or a back side of a transparent member 110, but preferably formed on the back side.

As a first embodiment of a coating layer 120, the coating layer 120 is composed of one layer. A material for the coating layer 120 is preferably titanium oxide ($TiO_2$) or silicon oxide ($SiO_2$). In addition, a material for the coating layer 120 may include one component selected from the group consisting of nickel (Ni), aluminum (Al), chrome (Cr), titanium (Ti), $Nb_2O_5$, $Al_2O_3$, and H mixture. A thickness of the coating layer 120 is preferably 0.01 to 2 μm.

As a second embodiment of a coating layer 120, the coating layer 120 includes a plurality of layers. The plurality of layers preferably includes a first layer formed with titanium oxide ($TiO_2$) and a second layer formed with silicon oxide ($SiO_2$). The first layer has a high refractive index and the second layer has a low refractive index. The refractive index of the coating layer 120 may be adjusted according to the number of layering the first layer and second layer. A thickness of the coating layer 120 is preferably 0.01 to 2 μm. In addition, a photo transmittance of the coating layer 120 is preferably 50 to 95%.

As a third embodiment of the coating layer 120, the coating layer 120 includes a plurality of layers, and preferably the plurality of layers includes two components selected from the group consisting of nickel (Ni), aluminum (Al), chrome (Cr), and titanium (Ti). A thickness of the coating layer 120 is preferably 0.01 to 2 μm. In addition, a photo transmittance of the coating layer 120 is preferably 10 to 95%.

A coating layer 120 is preferably formed by using any one method selected from the group consisting of a spray method, a deposition method, an E-beam method, and a sputter method.

Figure 3B:
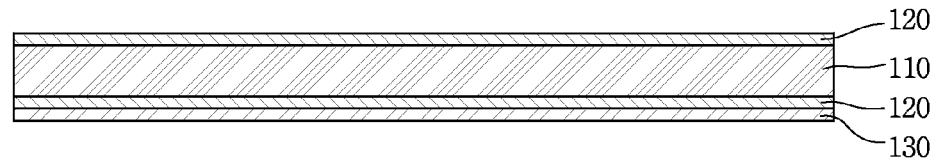
FIG. 3B is a cross-sectional view illustrating that a dry film photoresist is formed on one of the two coating layers.

After processing the coating step (S210), as illustrated in FIG. 3B, a dry film photoresist (DFR) 130 is attached on the coating layer 120 (S220). Preferably, the dry film photoresist 130 is heated at 70 to 110° C., and then attached on the coating layer 120.

Figure 3C:
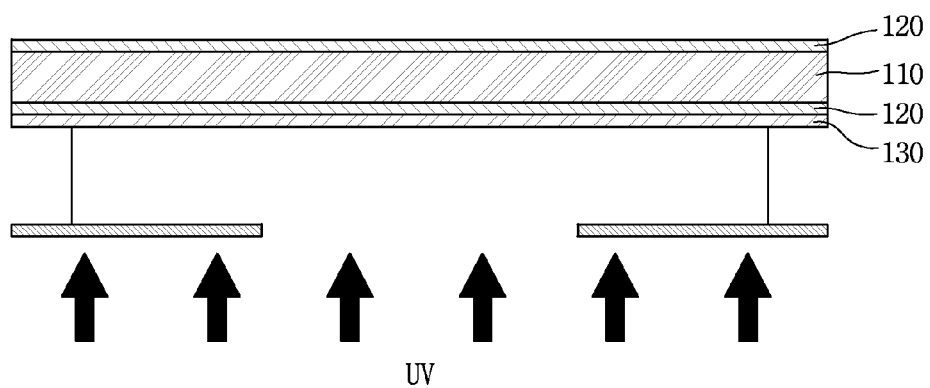
FIG. 3C is a cross-sectional view illustrating that the dry film photoresist is exposed to Ultra Violet using a photo mask.

After processing an attaching step (S220) of the dry film photoresist 130, as illustrated in FIG. 3C, an exposure step (S230) of the dry film photoresist 130 is performed by covering the dry film photoresist 130 with a photo mask 140 having an image pattern and irradiating a photo mask 140 with UV (Ultra Violet). The image pattern of the photo mask 140 may be an image of various shapes, such as logos of manufacturers, texts, for example, a name of a user, or characters, for example, animals or human being. An area of the dry film photoresist 130 irradiated with UV by the photo mask 140 is an image area corresponding to an image pattern of the photo mask 140. When the dry film photoresist 130 is irradiated with UV, the area of the dry film photoresist 130 irradiated with UV is cured by UV energy. After contacting the dry film photoresist 130 with the photo mask 140, and then irradiating with UV, the photo mask 140 is separated from the dry film photoresist 130.

Figure 3D:
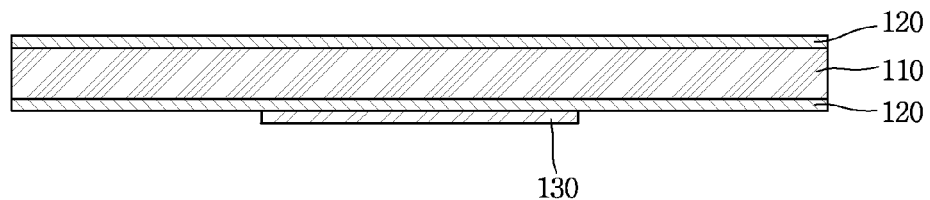
FIG. 3D is a cross-sectional view illustrating that an image area of the dry film photoresist is formed on the coating layer by removing other area of the dry film photoresist except for the image area of the dry film photoresist.

After processing an exposure step (S230), as illustrated in FIG. 3D, a development process (S240) is performed, which removes other area of the dry film photoresist 130 except for an image area of the dry film photoresist 130 irradiated with UV through the image pattern of the photo mask 140. After processing the development process, the image area of the dry film photoresist 130 is only remained on the coating layer 120.

A developed solution used for the development process includes preferably one selected from the group consisting of benzene derivatives such as hydroquinone, metol, pyrogalol, and aminophenol, or phenidone that is a piyrazolidone derivative. In addition, a development accelerator may be used by mixing sodium carbonate, potassium carbonate, and the like, with water, a stabilizer may be used by mixing sodium sulfate with water, and an inhibitor may be used by mixing potassium bromide with water.

Meanwhile, the development process may remove only an image area of a dry film photoresist 130 irradiated with UV.

Figure 3E:
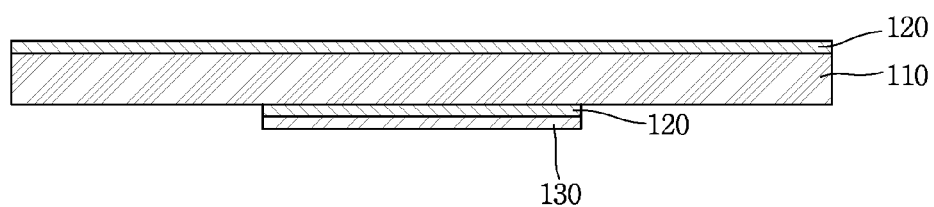
FIG. 3E is a cross-sectional view illustrating that an image area of the coating layer is formed on the transparent member by removing other area of the coating layer except for the image area of the coating layer facing the image area of the dry film photoresist.

After processing a development process, as illustrated in FIG. 3E, an etching process (S250) is performed to remove other area of a coating layer 120 except for an image area of the coating layer 120 facing an image area of the dry film photoresist 130. The image area of the coating layer 120 is a part covered with the image area of the dry film photoresist 130. The etching process may be performed by using various methods, such as a wet etching or a dry etching.

Figure 3F:
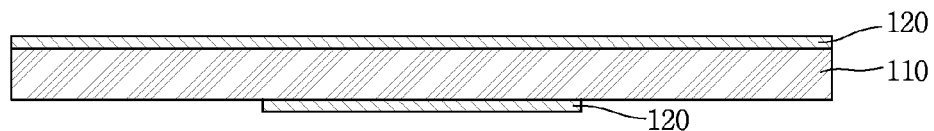
FIG. 3F is a cross-sectional view illustrating that the image area of the coating layer is only formed on the transparent member by removing the image area of the dry film photoresist.

After processing an etching process, as illustrated in FIG. 3F, a strip process (S260) is performed, which removes an image area of a dry film photoresist 130. After processing the etching process, the image area of the coating layer 120 is only remained on the transparent member 110. As described above, the image area of the coating layer 120 may be various shapes, such as logos of manufacturers, texts, for example, a name of a user, characters, for example, animals or human being.

According to an embodiment of the present invention, a transparent member having an image includes a transparent member 110, and a coating layer 120 having an image shape that has a smaller size than that of the area of the transparent member 110 and a thickness of 0.01 to 2 μm on the surface of the transparent member 110 (see FIGS. 3F and 2). The coating layer 120 is composed of one layer. The one layer is composed of titanium oxide or silicon oxide material. In addition, it may include one component selected from the group consisting of nickel (Ni), aluminum (Al), chrome (Cr), titanium (Ti), $Nb_2O_5$, $Al_2O_3$, and H mixture.

Meanwhile, the coating layer 120 may be composed of a plurality of layers. The plurality of layers includes a first layer formed with titanium oxide and a second layer formed with silicon oxide. A photo transmittance of the coating layer 120 is preferably 50 to 95%.

The coating layer 120 is composed of a plurality of layers, and the plurality of layers may include two components selected from the group consisting of nickel (Ni), aluminum (Al), chrome (Cr), and titanium (Ti). A thickness of the coating layer 120 is preferably 0.01 to 2 μm. In addition, a photo transmittance of the coating layer 120 is preferably 10 to 95%.

The transparent member having an image according to the present invention may be preferably produced by using the method as described above. Meanwhile, the transparent member having an image according to the present invention may be also produced by using the methods other than the method described above.

Hereinafter, a function and effect of a transparent member having an image and the method for forming an image on the transparent member according to the present invention are as follows:

As described above, the transparent member having an image according to the present invention may be a transparent cover constituting a touch screen of IT devices. In addition, the transparent member 110 may be a transparent protective cover attached on a surface of a touch screen of the IT devices. First, when the transparent cover having an image is a transparent protective cover attached on a surface of a touch screen of a smartphone, a back side of the transparent member 110, that is, the side having an image coating layer 120 is contacted to the surface of the touch screen. In this state, when the smart phone is turned on, an information screen of the smart phone is displayed. At this time, light exhibiting the information screen of the smartphone is seen by a user through transmitting a touch screen and a transparent member 110 having an image, that is, a transparent protective cover having an image, and an image coating layer 120 included in a back side of the transparent protective cover is not seen by a user through transmitting with the light of information screen, and the information screen is only seen by a user. Meanwhile, when the smartphone is turned off, there is no light exhibiting an information screen on the smartphone, so that external light is transmitted to the transparent protective cover and refraction-reflected by the image coating layer 120. For this reason, in a state in which the smartphone is turned off, the image of the image coating layer 120 is seen by a user.

As described above, in a case in which the transparent member having an image according to the present invention is a transparent cover of a touch screen of a smartphone, when the smartphone is turned on, an information screen of the smartphone is seen by a user through transmitting the transparent cover and an image coating layer 120. At this time, the image coating layer 120 included in a back side of the transparent cover is not seen by eyes of a user and the information screen is only seen by eyes of user through transmitting the light of the information screen. Meanwhile, when the smartphone is turned off, there is no light exhibiting an information screen on the smartphone, so that external light is transmitted to the transparent cover of the touch screen, and refraction-reflected by the image coating layer 120. For this reason, in a state in which the smartphone is turned off, the image of the image coating layer 120 is seen by a user.

As set forth above, according to exemplary embodiments of the invention, since an image coating layer 120 is formed by using one part of the process for producing semiconductors, the production process is simple, and the production cost is low.

As described above, according to exemplary embodiments of the invention, a damage of an image is prevented when using IT devices, because an image having various shapes such as logos of manufacturer, texts, for example, a name of a user, and shapes of animals or human being, are not formed on the side in contact with a user, but included in an inner side surface.

In addition, according to exemplary embodiments of the invention, since when IT devices are turned off, an image such as a logo or character are seen on the display area of IT devices, while when IT devices are turned on, the image such as a logo or character are not seen, but an information screen is only seen, a user does feel comfortable seeing the information screen, and also a user can feel a mysterious feeling and aesthetic effect. In addition, when the image is a logo of the manufacturer, a successful advertising can be obtained.

While the present invention has been shown and described in connection with the exemplary embodiments, it will be apparent to those skilled in the art that modifications and variations can be made without departing from the spirit and scope of the invention as defined by the appended claims.

What is claimed is:

1. A method for forming an image on a transparent member, the method comprising:
   a) forming a coating layer on a surface of the transparent member;
   b) attaching a dry film photoresist on the coating layer;
   c) exposing the dry film photoresist by covering the dry film photoresist with a photo mask having an image pattern and irradiating the photo mask with UV;
   d) performing a development process for removing other area of the dry film photoresist except for an image area of the dry film photoresist irradiated with UV through the image pattern of the photo mask;
   e) performing an etching process for removing other area of the coating layer except for the image area of the coating layer facing the image area of the dry film photoresist; and
   f) performing a strip process for removing the image area of the dry film photoresist,
   wherein in the step f), after removing the dry film photoresist, a photo transmittance of the image coating layer formed on the transparent member is 50 to 95%, and when a side of the transparent member having the image coating layer is referred to as a back side and an opposite side thereof is referred to as a front side, in the case of irradiating the back side of the transparent member with light, the image coating layer is not seen on the front side of the transparent member and in the case of not irradiating with light, the image coating layer is seen on the front side of the transparent member.

2. The method of forming an image on a transparent member according to claim 1, wherein the coating layer includes titanium oxide ($TiO_2$) or silicon oxide ($SiO_2$).

3. The method of forming an image on a transparent member according to claim 1, wherein the coating layer is composed of a plurality of layers and the plurality of layers include a first layer formed with titanium oxide ($TiO_2$) and a second layer formed with silicon oxide ($SiO_2$).

4. The method of forming an image on a transparent member according to claim 1, wherein the coating layer includes one or more components selected from the group consisting of nickel (Ni), aluminum (Al), chrome (Cr), titanium (Ti), $Nb_2O_5$, and $Al_2O_3$.

5. The method of forming an image on a transparent member according to claim 1, wherein the coating layer of the step a) is formed by using any one method selected from the group consisting of a spray method, a deposition method, an E-beam method and a sputter method.

6. The method of forming an image on a transparent member according to claim 1, wherein the transparent member is a transparent cover constituting a touch screen of IT device.

7. The method of forming an image on a transparent member according to claim 1, wherein the transparent member is a transparent protective cover attached on a surface of a touch screen in IT device.

* * * * *